United States Patent [19]
Chen

[11] Patent Number: 5,600,604
[45] Date of Patent: Feb. 4, 1997

[54] SYSTEM FOR ALLOWING A SIMM MODULE WITH ASYMMETRIC ADDRESSING TO BE UTILIZED IN A COMPUTER SYSTEM

[75] Inventor: Roger Chen, San Jose, Calif.

[73] Assignee: Advanced Peripherals Labs, Inc., San Jose, Calif.

[21] Appl. No.: 431,439

[22] Filed: May 1, 1995

[51] Int. Cl.$^6$ ......................................... G11C 8/00
[52] U.S. Cl. ............... 365/230.06; 365/193; 365/230.02
[58] Field of Search ................ 365/193, 230.02, 365/230.06, 189.02, 233

[56] References Cited

U.S. PATENT DOCUMENTS

4,792,929  12/1988  Olson et al. .................. 365/193 X
5,305,277  4/1994  Derwin et al. ............... 365/230.06 X
5,392,252  2/1995  Rimpo et al. ................. 365/230.02

Primary Examiner—Do Hyun Yoo
Attorney, Agent, or Firm—Benman Collins & Sawyer

[57] ABSTRACT

A circuit for allowing a memory module with an asymmetric addressing scheme to effectively operate with a memory controller which a symmetric address scheme is disclosed. The circuit includes a demultiplexer for receiving at least a last address bit from the memory controller and generating a plurality of control signals and a decoder. The decoder includes a plurality of decoder units. Each of the decoder units includes logic for receiving one of the plurality of control signals, a first strobe signal and a second strobe signal from the memory controller. Each of the decoder units also selectably provides a decoded second strobe signal responsive to the demultiplexer.

3 Claims, 8 Drawing Sheets

SYSTEM FOR ALLOWING A SIMM MODULE WITH ASYMMETRIC ADDRESSING TO BE UTILIZED IN A COMPUTER SYSTEM

FIELD OF THE INVENTION

The present invention relates to a memory module in a computer system and more particularly to providing a plurality of different types of memory modules in a computer system.

BACKGROUND OF THE INVENTION

Computers using memory such as dynamic random access memory (DRAM) are well known in the art. Personal computers such as IBM AT and compatibles, use such DRAM memories for a variety of functions. Development in the personal computer (PC) industry has been the widespread acceptance of single inline memory modules (SIMMS). Such SIMMS are used to lower the cost of memory and many higher density memory subsystems can be designed using SIMMS. Since the SIMMS are relatively small modules, they are used extensively in the computer industry to allow for the proper operation. The DRAM chips themselves are very reliable.

Therefore, errors due to the DRAM chip are less common than when PCs were first introduced. At the same time cost of the personal computers has dropped dramatically and profit margins have been squeezed by intense competition. Typically in known computer systems a particular type of SIMM module is utilized therewithin. That SIMM module requires a particular addressing scheme for adequate operation.

Hence, the addressing scheme is oftentimes limited to a particular type of DRAM, as there have become more and more different types of DRAMs. As more and different types of DRAMs come into existence with different types of addressing schemes, it becomes more difficult to design these different modules into a computer. This difficulty occurs because the memory controller used to control the SIMM module, or the memory within the computer, must generally be adaptable to driving one type of addressing scheme. To make a more complicated and complex memory controller would require additional expense to the personal computer. Many memories are not compatible with existing personal computers because their addressing schemes are very different than the existing addressing scheme.

More specifically, a typical computer system includes a memory controller addresses the SIMM module providing one half of the address bits during the row address strobe (RAS) and providing the other half of the address bits during the column address strobe (CAS) signal. These are some SIMM modules that can only be addressed asymmetrically, that is, there is an odd number of address bits required to efficiently access the memory. These types of SIMM modules cannot be utilized with a typical memory controller without substantial modification thereof. These modifications would require a redesigning of the memory controller to support the different SIMM modules. This may increase the engineering cost related to the computer system.

Accordingly, many SIMM module manufacturers cannot use these types of DRAMs because of their addressing scheme. What is desired therefore is a system for allowing for different types of memory modules with different addressing schemes to be substituted for existing memory modules, so as to allow for increased memory capacity with resultant lower cost associated with the new memory units. The system that is developed should be cost effective, should not add undue complexity to the existing circuitry, and should also be compatible with existing circuitry. The present invention addresses such a need.

SUMMARY OF THE INVENTION

A circuit for allowing a memory module with an asymmetric addressing scheme to effectively operate with a memory controller which a symmetric address scheme is disclosed. The circuit comprises a demultiplexer means for receiving at least a last address bit from the memory controller and generating a plurality of control signals and a decoder means. The decoder means includes a plurality of decoder units. Each of the decoder units includes logic means for receiving one of the plurality of control signals, a first strobe signal and a second strobe signal from the memory controller. Each of the decoder units also selectably provides a decoded second strobe signal responsive to the demultiplexer means.

DETAILED DESCRIPTION OF THE DRAWINGS

The present invention relates to an improvement in the utilization of memory modules in computers. The following description is presented to enable one of ordinary skill in the art to make and use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1:
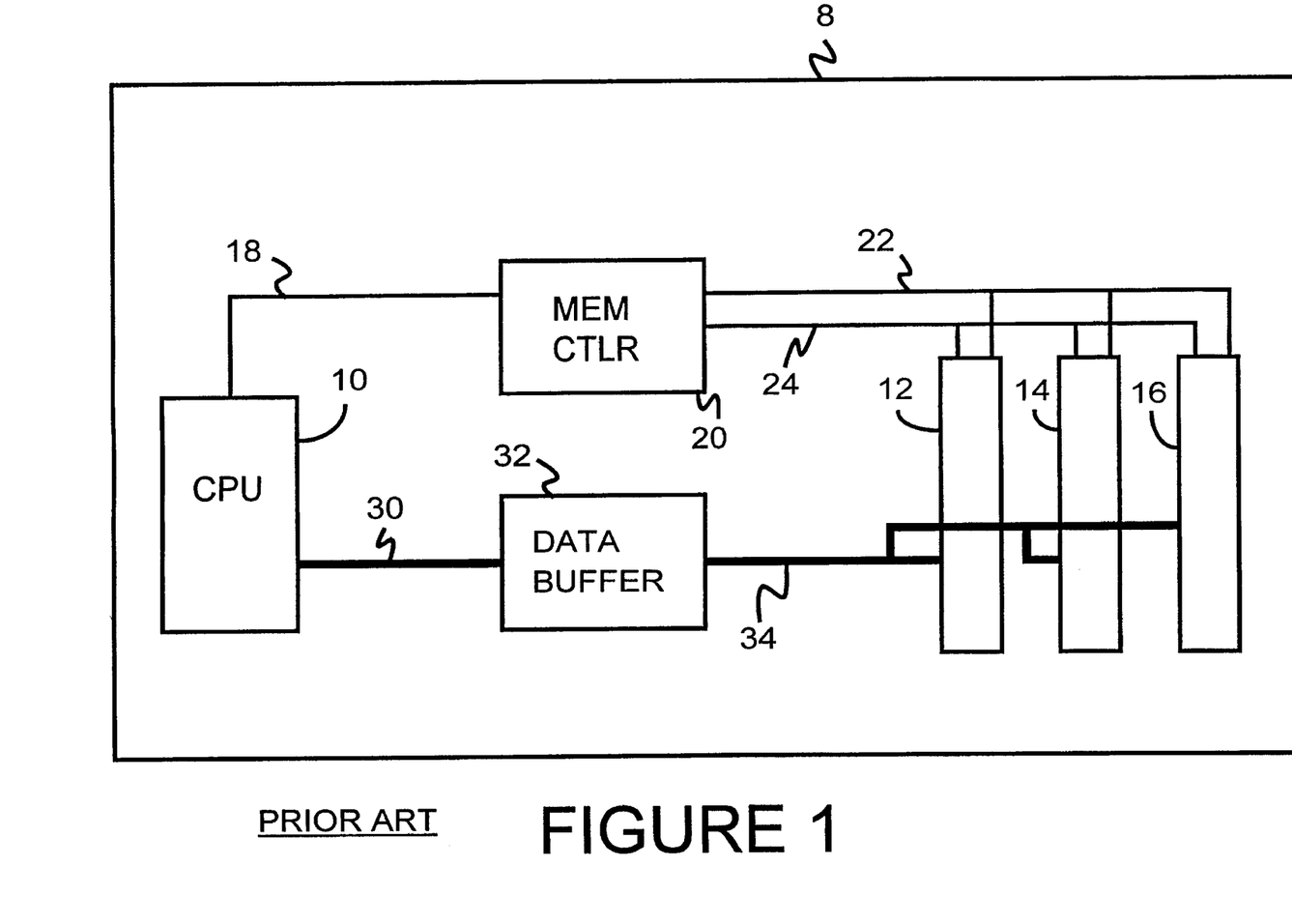
FIG. 1 is a block diagram of a simplified computer system.

FIG. 1 is a block diagram of a simplified PC system showing components located on system mother board 8. CPU 10 reads instructions from and transfers data to DRAM memory in SIMMs, located in one or more of banks 12, 14, 16. A system having only one SIMM bank populated with DRAM may be shipped to the user, who may later add additional DRAM by installing additional SIMMs. For example, a system may ship with a DRAM SIMM installed in bank 12, but with banks 14 and 16 empty. The user may later plug in a second SIMM bank 14 to increase memory use.

The CPU outputs an address on local address bus 18 to memory controller 20. Memory controller 20 decodes the address and activates control lines 22 to enable reading or writing to the DRAMs located in SIMM banks 12, 14, or 16. Control lines 22 typically include row address strobe (RAS), column address strobe (CAS), and write-enable (WE). Memory address lines 24 contain a multiplexed address for the DRAM inputs.

Data is transferred from CPU 10 to DRAM in SIMM banks 12, 14, 16 along local data bus 30, through data buffer 32, and onto memory data bus 34, which is connected to SIMM banks 12, 14, 16.

Figure 1A:
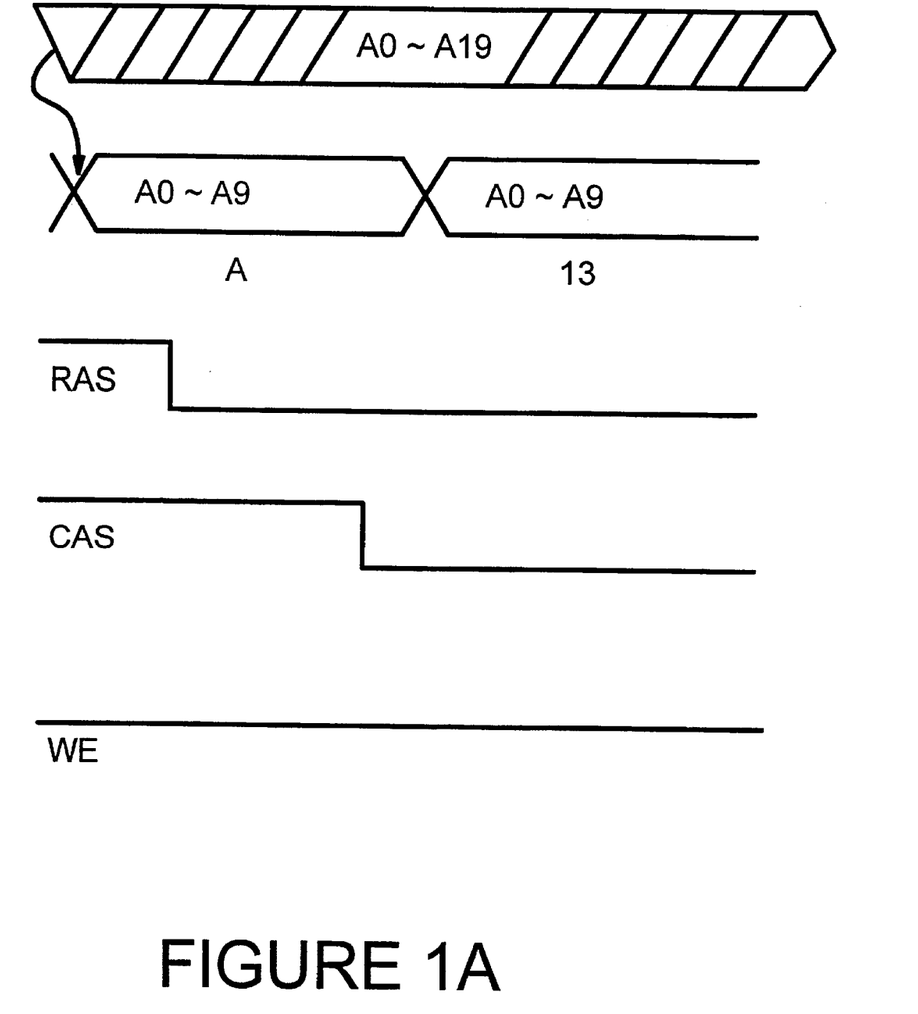
FIG. 1A shows waveforms for a particular DRAM configuration.
Figure 2:
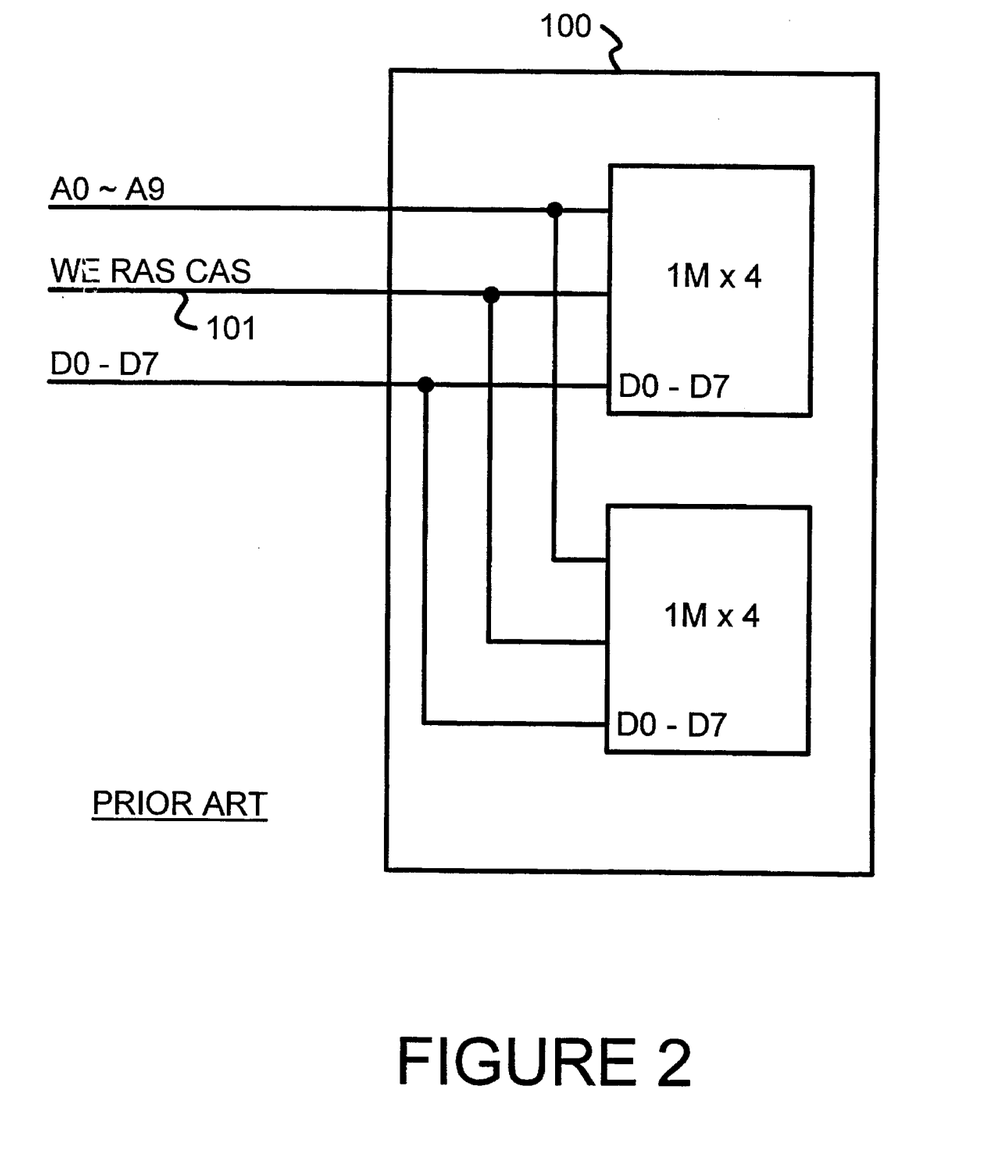
FIG. 2 is a simple block diagram of a conventional SIMM module.

FIG. 2 is a simple block diagram of a SIMM module including two DRAMs and a 1 megabit by 4. In such a SIMM module 100, there are address signals A0 to A9 which are provided to both of the DRAMs, a write enable, RAS and CAS signals provided via bus 101 to the DRAMs and data signals D0 through D7 provided to the DRAM. Typically, these signals are provided by a memory controller under control of the CPU. The addressing scheme for a memory controller is one half of the address bits are provided during the RAS cycle and then one half of the address bits are provided during the CAS cycle. Referring to FIG. 1A, what is shown are waveforms for a particular set of DRAMs. Accordingly, in a typical memory controller, there may be 20 address bits. Therefore, 10 address bits will be provided during the RAS shown at port A, and 10 bits will be provided during the CAS shown at port B.

However, it is well known that there are some memory SIMM modules which will not accommodate this, i.e., asymmetric addressing scheme, that is, the addressing scheme will have an odd number of bits for the RAS and the CAS. For example, an addressing scheme may have 19 bits in which 10 bits are for the RAS and 9 bits are for the CAS. Such SIMM modules can not be effectively used within a typical system. The present invention addresses this problem by providing a CAS decoder which allows for a system that has a symmetric addressing scheme to use a memory that is asymmetric in addressing.

Figure 3:
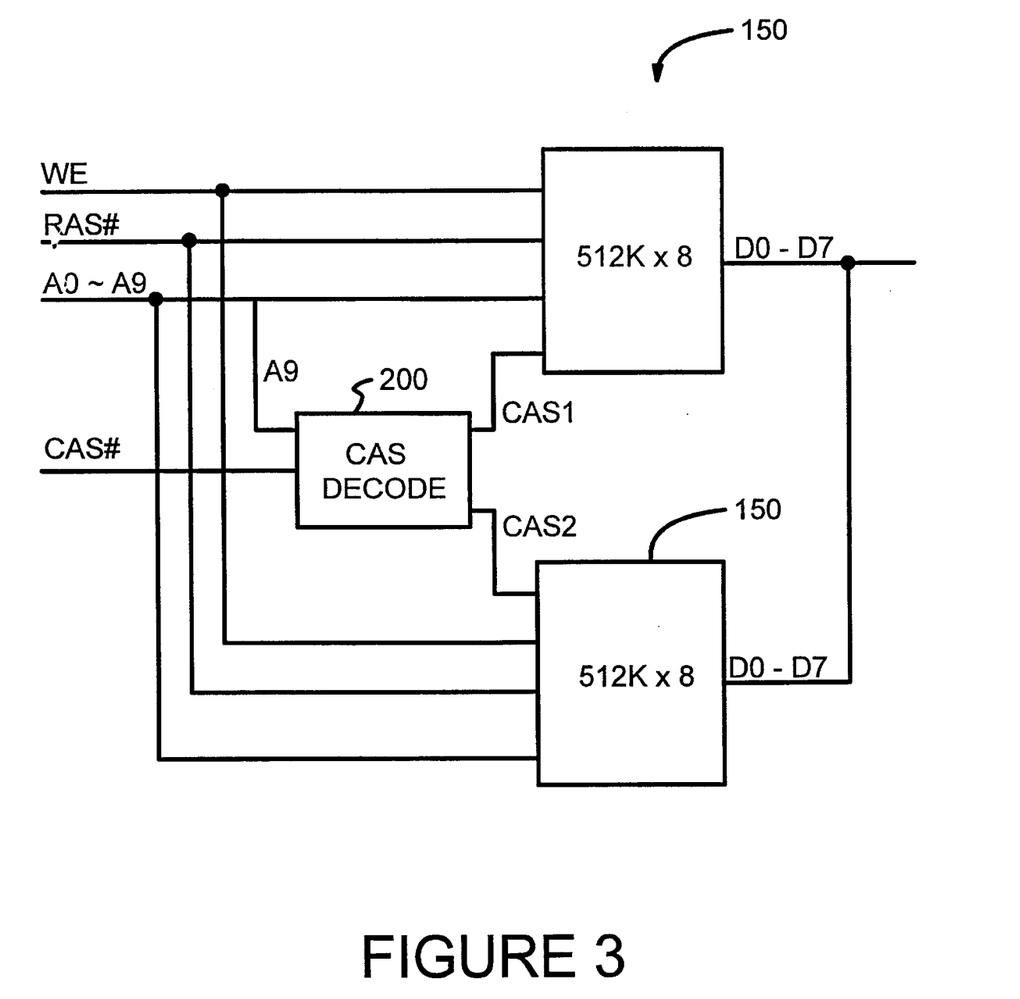
FIG. 3 is a block diagram of a SIMM module in accordance with the present invention.

To more specifically understand the present invention, refer now to FIG. 3, which is a block diagram of a system in accordance with the present invention. As is seen, the SIMM module are two 512k×8 memories 150 which receive the WE signal, the RAS signal, A0 to A9 signal. There is also the CAS decoder 200 which receives the CAS signal and the last bit of the address signals. These types of memories provide 10 bits from the RAS and 9 bits from the CAS. Accordingly, the last bit is utilized along with the CAS signal from the memory controller to provide two CAS signals, CAS 1 and CAS 2, to the first and second memories, respectively. These signals are never enabled simultaneously during normal operation. In providing these CAS signals, the device provides a symmetric rather than the asymmetric signal that would be provided ordinarily. In so doing, memories having asymmetric addressing schemes can be used with the symmetric memory controller and both memories can be fully accessed for memory read and write operations.

Figure 4:
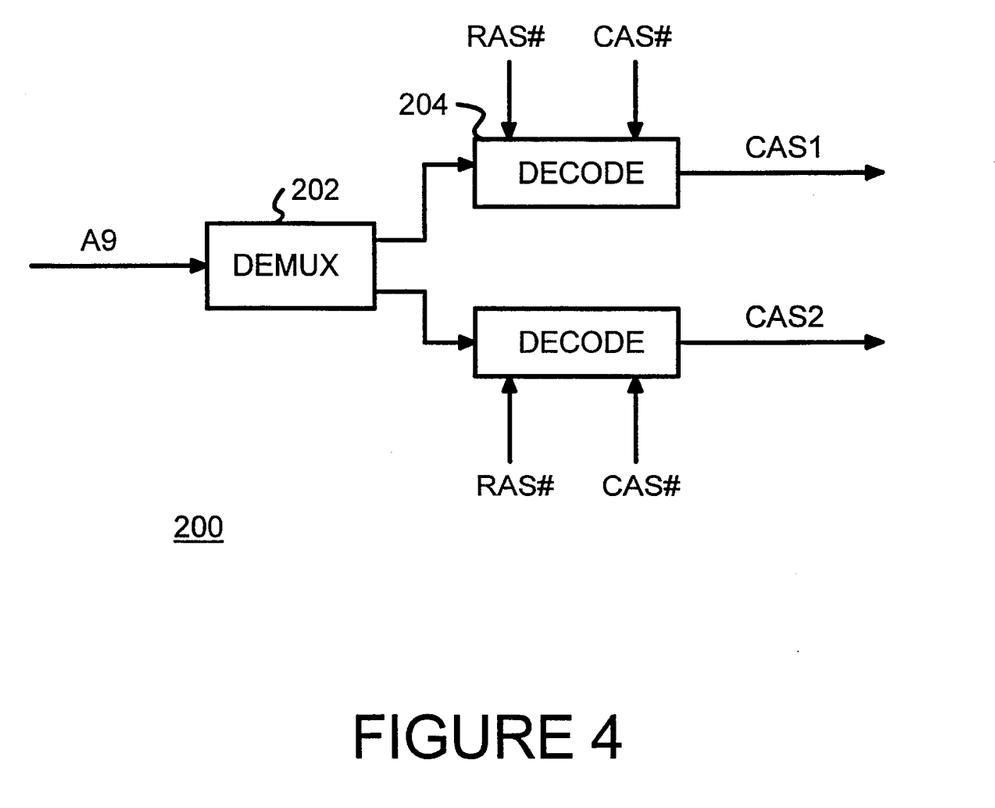
FIG. 4 shows a simple block diagram of a first embodiment of a CAS decoder circuit in accordance with the present invention.

Referring now to FIG. 4, what is shown is a more detailed diagram of the CAS decoder circuit 200 in accordance with the present invention. The CAS decoder circuit 200 described includes a demultiplexer 202 with two outputs which are provided to two different decoder units 204. Each of the decoder units also receives the RAS signal from the memory controller. In each of the elements, depending upon the logic level of A9, and the CAS signal provides either CAS1 or CAS2 signals to the memory banks shown in FIG. 3. Accordingly, if for example, the A9 bit is high, then CAS2 would allow the bits from the memory to be accessible.

Figure 5:
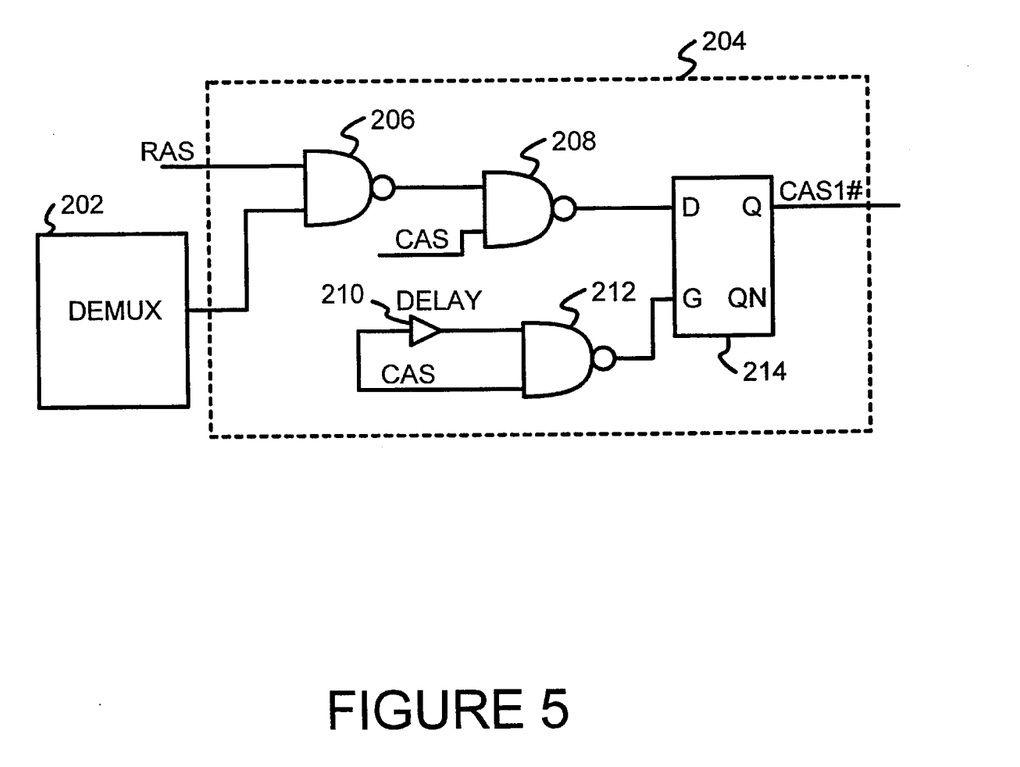
FIG. 5 is a more detailed diagram of the CAS decoder circuit of FIG. 4.

FIG. 5 is a logic diagram of one decoder unit 204 of FIG. 4. As is seen, the demux 202 output is provided to a first input of NAND gate 206. The RAS signal is provided to a second input of NAND gate 206. The output of NAND gate 206 is provided to a first input of NAND gate 208. The CAS signal is provided to a second input of NAND gate 208. The output of NAND gate 208 is coupled to the input of a transparent latch 214.

The output of NAND gate 212 is coupled to the G (go) input of the transparent latch 214. The inputs of NAND gate 212 are coupled together, one input having a delay block 210. The output of transparent latch 214 is the decoded CAS signal. The decoder unit 204 provides one of the decoded CAS signals to the memory bank dependent on the state of the A9 signal.

Figure 5A:
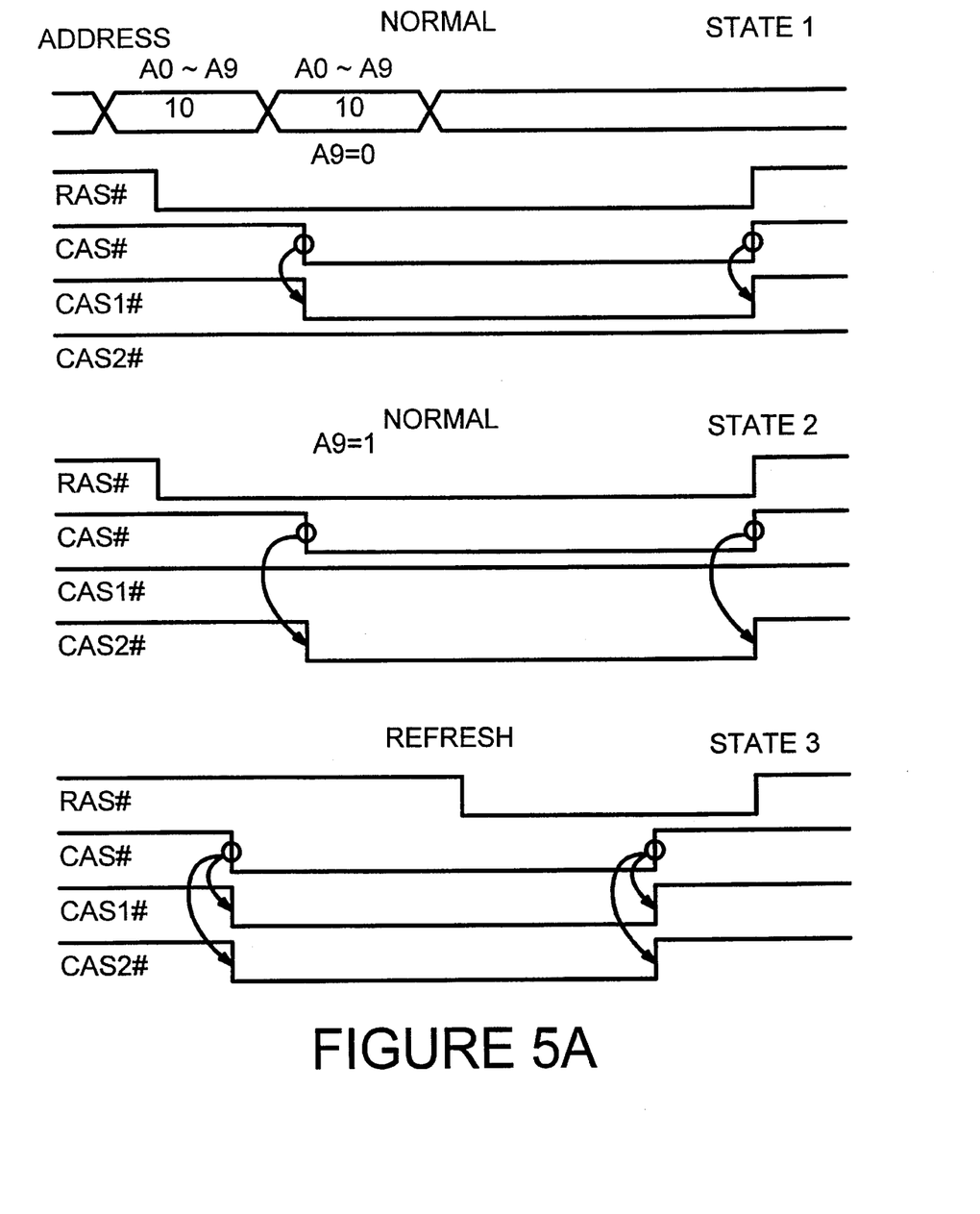
FIG. 5A are waveforms associated with the computer system of FIG. 5.

As has been mentioned, the CAS1 and CAS2 signals are not both active during normal read/write operation. However, during CAS before RAS refresh cycle, both CAS1 and CAS2 will be active. The decoder 204 allows for this operation. Referring to the timing diagram shown in FIG. 5A, during normal operation, when the RAS is low and the next CAS goes low (STATE 1). The state A9 bit (bit=0), determines that CAS1 goes low, when bit A9_1 then CAS2 goes low (STATE 2). When a CAS before RAS refresh operation takes place, CAS# goes low before the RAS goes low. CAS1 and CAS2 are therefore both active low (STATE 3).

Accordingly, a system is provided which allows a bank of DRAMs that has an asymmetric addressing scheme to be utilized with a conventional memory controller that has a symmetrical addressing scheme. By utilizing the logic state of at least the last bit and one of strobe address signals, an additional strobe address signal can be provided to the memory module to allow the addressing scheme to become symmetrical.

Figure 6:
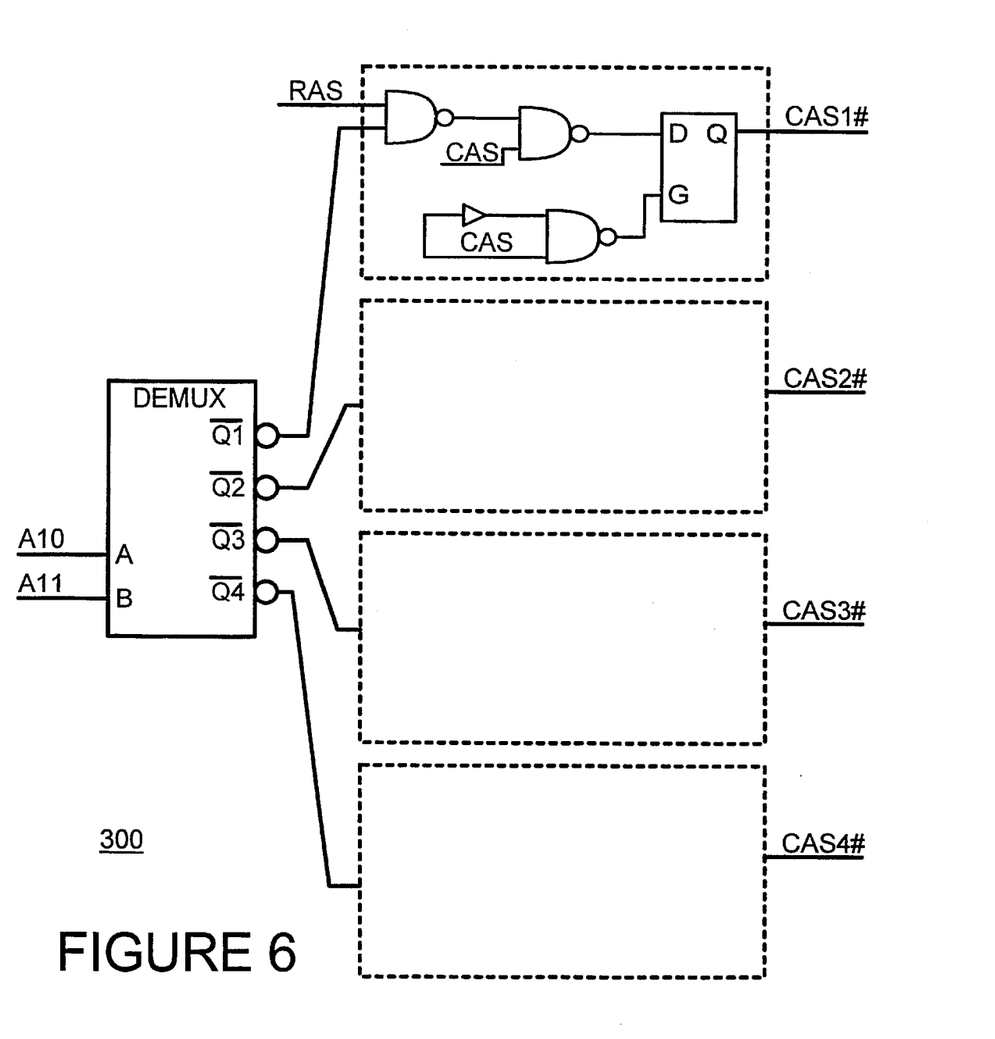
FIG. 6 shows a simple block diagram of a second embodiment of a CAS decoder circuit in accordance with the present invention.

The present invention has been described in resolving a one bit difference when there are two DRAM modules. If there are four memory modules for example that must accommodate a conventional addressing scheme. Referring now to FIG. 6, what is shown is a simple and detailed block diagram memory module system 300 in accordance with the present invention. As is seen, in this embodiment, there are 4 CAS signals provided based upon last (A11) and next to last (A10) signals being utilized to provide the decoded CAS signals. As can be seen, the number of address signals required for generation of the new decoded CAS signals is proportional to $2^N$, where N is the number of address signals.

Although the present invention has been described in the context of a particular memory and particular addressing scheme, one of ordinary skill in the art will readily recognize a wide variety and types of memories could be utilized in conjunction with a number of addressing schemes and their use would be within the spirit and scope of the present invention. For example, in this embodiment the CAS signal is the signal that requires the additional bit, however, one of ordinary skill in the art readily recognizes that a particular memory module may have asymmetry due to the RAS signal requiring the additional bit. Accordingly, the RAS signal could be decoded to allow for the proper utilization of the memory.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skill in the art without departing from the spirit and scope of the present invention, the scope of which is defined by the appended claims.

I claim:

1. A circuit for allowing a memory module with an asymmetric addressing scheme to effectively operate with a memory controller which has a symmetric address scheme, the circuit comprising:

a demultiplexer means for receiving at least the last address bit of address signals from the memory controller and generating a plurality of control signals; and a decoder means, the decoder means including a plurality of decoder units, each of the decoder units comprising logic means for receiving one of the plurality of control signals, two address strobe signals from the memory controller, each of the decoder units selectably providing a decoded one of the two address strobe signals responsive to the demultiplexer means.

2. The circuit of claim 1 in which the two address strobe signals comprises a row address strobe (RAS) signal and a column address strobe (CAS) signal.

3. The circuit of claim 2 in which each of the decoder units comprises:

decoder circuit for receiving the RAS and CAS signals and providing output signal; and transmission gate for holding the output signal and providing a decoded CAS signal.

* * * * *